US012606900B2

(12) United States Patent
Hong et al.

(10) Patent No.: US 12,606,900 B2
(45) Date of Patent: Apr. 21, 2026

(54) DEPOSITION APPARATUS AND DEPOSITION METHOD USING DEPOSITION APPARATUS

(71) Applicant: Samsung Display Co., Ltd., Yongin-si (KR)

(72) Inventors: Jaemin Hong, Yongin-si (KR); Hyoungwook Kim, Yongin-si (KR); Seongcheol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/314,231

(22) Filed: May 9, 2023

(65) Prior Publication Data

US 2023/0407452 A1      Dec. 21, 2023

(30) Foreign Application Priority Data

Jun. 20, 2022    (KR) ........................ 10-2022-0075173

(51) Int. Cl.
*C23C 14/04* (2006.01)

(52) U.S. Cl.
CPC ................................. *C23C 14/042* (2013.01)

(58) Field of Classification Search
CPC .................................................. C23C 14/042
See application file for complete search history.

(56) References Cited

U.S. PATENT DOCUMENTS

| | | | | |
|---|---|---|---|---|
| 3,314,395 A | * | 4/1967 | Hemmer | C23C 14/042 |
| | | | | 118/727 |
| 4,344,988 A | * | 8/1982 | Sono | C23C 14/042 |
| | | | | 118/721 |
| 6,084,938 A | * | 7/2000 | Hara | G21K 5/10 |
| | | | | 378/34 |
| 9,325,007 B2 | | 4/2016 | Kwak et al. | |

(Continued)

FOREIGN PATENT DOCUMENTS

| | | |
|---|---|---|
| CN | 113140592 | 7/2021 |
| JP | 2013-204129 | 10/2013 |

(Continued)

OTHER PUBLICATIONS

English translation KR 20210057117, Bangert, May 20, 2021 (Year: 2021).*

*Primary Examiner* — Keath T Chen

(74) *Attorney, Agent, or Firm* — Lerner David LLP

(57) ABSTRACT

A deposition apparatus and a deposition method by using the deposition apparatus are provided. The deposition apparatus includes a mask including deposition openings, a mask frame supporting the mask and including first, second, third, and fourth portions and an opening overlapping the deposition openings and surrounded by the first, second, third, and fourth portions, a stage disposed on a rear surface of the mask frame, a pin unit connected to the stage, and a magnet unit disposed on a rear surface of the stage and overlapping the mask frame. The first portion and the second portion of the mask frame extend in a first direction, and the third portion and the fourth portion of the mask frame extend in (Continued)

a second direction intersecting the first direction, and the pin unit supports a side surface of the first portion of the mask frame and is movable in the second direction.

15 Claims, 12 Drawing Sheets

(56) References Cited

U.S. PATENT DOCUMENTS

| | | | |
|---|---|---|---|
| 9,657,392 B2 | 5/2017 | Han | |
| 9,771,645 B2 | 9/2017 | Han | |
| 2004/0163592 A1* | 8/2004 | Abiko | C23C 14/042 |
| | | | 118/715 |
| 2007/0231939 A1* | 10/2007 | Kuriya | H01J 37/3452 |
| | | | 438/22 |
| 2019/0368024 A1* | 12/2019 | Heymanns | H01L 21/67712 |
| 2020/0010951 A1* | 1/2020 | Jakob | C23C 14/042 |
| 2020/0027767 A1* | 1/2020 | Zang | C23C 14/50 |
| 2020/0251691 A1* | 8/2020 | Heymanns | H01L 21/682 |
| 2021/0328147 A1* | 10/2021 | Vercesi | C23C 14/56 |
| 2021/0335640 A1* | 10/2021 | Heymanns | H01L 21/68785 |

FOREIGN PATENT DOCUMENTS

| | | |
|---|---|---|
| KR | 20120101662 A | 9/2012 |
| KR | 10-2014-0074614 | 6/2014 |
| KR | 10-2017-0123932 | 11/2017 |
| KR | 20190128196 A | 11/2019 |
| KR | 10-2021-0057117 | 5/2021 |
| KR | 10-2021-0094198 | 7/2021 |
| KR | 10-2359244 | 2/2022 |
| KR | 10-2373326 | 3/2022 |

* cited by examiner

DEPOSITION APPARATUS AND DEPOSITION METHOD USING DEPOSITION APPARATUS

CROSS-REFERENCE TO RELATED APPLICATION(S)

This application claims priority to and benefits of Korean Patent Application No. 10-2022-0075173 under 35 U.S.C. § 119, filed on Jun. 20, 2022, in the Korean Intellectual Property Office, the entire contents of which are incorporated hereby by reference.

BACKGROUND

1. Technical Field

Embodiments relate to a deposition apparatus and a deposition method by using the deposition apparatus for manufacturing a display panel.

2. Description of the Related Art

A display device such as a television, a mobile phone, a tablet computer, a navigation system, and a game machine may include a display panel for displaying an image. The display panel may include pixels. Each of the pixels may include a driving element such as a transistor and a display element such as an organic light emitting diode. The display element may be formed by depositing an electrode and a light emitting pattern on a substrate.

The light emitting pattern may be formed at a certain region by using a mask having a deposition opening formed therein. Recently, to improve production yield of the display panel, a deposition process technology by using a large-area mask is developed. However, in case that the mask is not aligned at a designed position in a deposition apparatus, accuracy of a position where the light emitting pattern is formed is deteriorated.

SUMMARY

Embodiments provide a deposition apparatus capable of improving deposition accuracy of large-area deposition, and a deposition method by using the deposition apparatus.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a deposition apparatus may include a mask including deposition openings, a mask frame supporting the mask and including first, second, third, and fourth portions and an opening surrounded by the first, second, third, and fourth portions and overlapping the deposition openings, a stage disposed on a rear surface of the mask frame, a pin unit connected to the stage, and a magnet unit disposed on a rear surface of the stage and overlapping the mask frame. Each of the first portion and the second portion of the mask frame may extend in a first direction, and each of the third portion and the fourth portion of the mask frame may extend in a second direction intersecting the first direction, and the pin unit may support a side surface of the first portion of the mask frame and may be movable in the second direction.

The pin unit may include a plurality of pins disposed in the first direction.

Each of the plurality of pins may be independently movable in the second direction.

The magnet unit may include a plurality of electro permanent magnets, and the plurality of electro permanent magnets may be disposed on the rear surface of the stage to overlap at least one of the first, second, third, and fourth portions of the mask frame.

The plurality of electro permanent magnets may include first electro permanent magnets overlapping the first portion or the second portion of the mask frame and second electro permanent magnets overlapping the third portion or the fourth portion of the mask frame, the first electro permanent magnets may be movable in the first direction, and the electro permanent magnets may be movable in the second direction.

The first electro permanent magnets and the second electro permanent magnets may be independently movable.

The deposition apparatus may further include an adjustable block spaced apart from the magnet unit on the rear surface of the stage, the adjustable block may overlap the mask frame in a plan view.

The adjustable block may have a variable length in a third direction intersecting the first direction and the second direction.

The adjustable block may include a plurality of adjustable blocks, and the plurality of adjustable blocks may include first adjustable blocks overlapping corner portions of the mask frame.

The plurality of adjustable blocks may further include second adjustable blocks overlapping the first portion or the second portion of the mask frame and third adjustable blocks overlapping the third portion or the fourth portion of the mask frame.

Each of the mask and the mask frame may include a metal.

The deposition apparatus may further include a chamber including an internal space where the mask, the mask frame, the stage, the pin unit, and the magnet unit are disposed, and the side surface of the first portion of the mask frame may face a bottom surface of the chamber.

According to an embodiment, a deposition apparatus includes a chamber including an internal space, a stage including a seating surface and a rear surface opposite to each other, the seating surface perpendicular to a bottom surface of the chamber, a mask frame disposed on the seating surface of the stage and including a plurality of portions and an opening surrounded by the plurality of portions, a mask disposed on the mask frame and overlapping the opening of the mask frame, a pin unit including a plurality of pins supporting a side surface of the mask frame extending a first direction substantially parallel to the bottom surface of the chamber, and a magnet unit disposed on the rear surface of the stage. The plurality of pins may be disposed on the seating surface of the stage, may be spaced apart from each other, and may be movable in a second direction substantially perpendicular to the first direction.

The magnet unit may include first electro permanent magnets disposed on a first portion of the stage extending in the first direction substantially parallel to the side surface of the mask frame, and second electro permanent magnets disposed on a second portion of the stage extending in the second direction substantially perpendicular to the side surface of the mask frame, the first electro permanent magnets may be movable in the first direction, and the second electro permanent magnets may be movable in the second direction.

The deposition apparatus may further include a plurality of adjustable blocks disposed on the rear surface of the stage spaced apart from the magnet unit, the plurality of adjustable blocks may be disposed on the first portion and the second portion of the stage, and the plurality of adjustable blocks may have variable lengths in a direction substantially perpendicular to the rear surface of the stage.

The plurality of adjustable blocks may include a first group of adjustable blocks disposed between the first electro permanent magnets in the first direction and a second group of adjustable blocks disposed between the second electro permanent magnets in the second direction.

According to an embodiment, a deposition method may include providing a stage including a seating surface and a rear surface opposite to each other, a pin unit connected to the seating surface of the stage, and magnet unit disposed on the rear surface of the stage, providing a mask frame and a mask on the seating surface of the stage, the mask coupled to the mask frame and including deposition openings, obtaining positions of deposition patterns formed by the deposition openings of the mask by simulation, and adjusting a force applied to the mask frame by moving the pin unit or by moving the magnet unit to adjust alignment positions of the mask and the mask frame based on the obtained positions of the deposition patterns.

The pin unit may include a plurality of pins disposed along a first direction and supporting a side surface of the mask frame extending in the first direction, and the plurality of pins may be movable in a second direction substantially perpendicular to the side surface of the mask frame to adjust the force applied to the side surface of the mask frame.

The magnet unit may include electro permanent magnets disposed to overlap the mask frame, and the electro permanent magnets may be movable in a direction substantially parallel to the rear surface of the stage to adjust the force applied to the mask frame.

The deposition method may further include providing adjustable blocks disposed on the rear surface of the stage and spaced apart from the magnet unit, and lengths of the adjustable blocks may be adjustable in a direction substantially perpendicular to the rear surface of the stage to adjust the force applied to the mask frame.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION OF THE EMBODIMENTS

Figure 1:
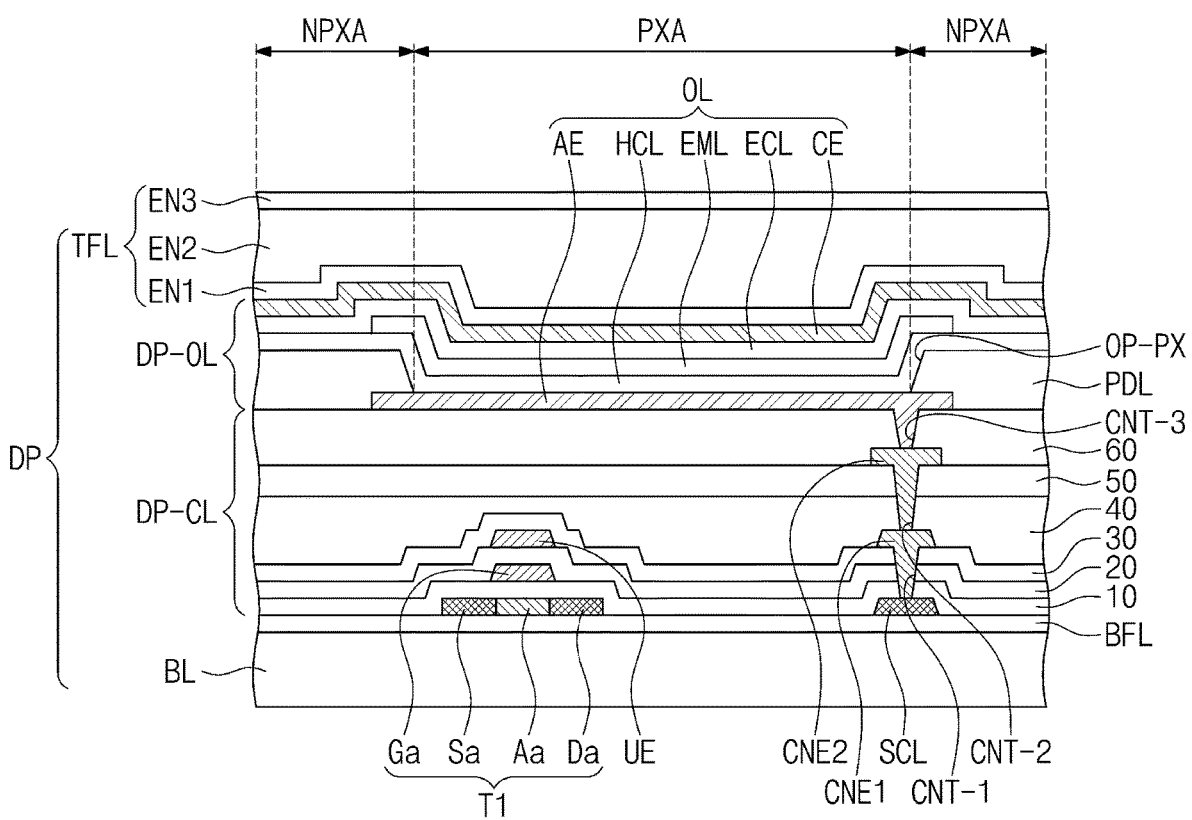
FIG. 1 is a schematic cross-sectional view of a display panel according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, a deposition apparatus and a deposition method by using the deposition apparatus according to an embodiment will be described with reference to the drawings.

FIG. 1 is a schematic cross-sectional view of a display panel DP according to an embodiment.

A deposition apparatus ED (refer to FIG. 2) according to an embodiment, which will be described below, may be used to form at least one of the functional layers included in the display panel DP. FIG. 1 illustrates a cross-section of the display panel DP manufactured by using the deposition apparatus ED (refer to FIG. 2).

In an embodiment, the display panel DP may be a light emitting display panel. For example, the display panel DP may include an organic light emitting display panel, an inorganic light emitting display panel, and a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include quantum dots and quantum rods. Hereinafter, the display panel DP will be described as an organic light emitting display panel for descriptive convenience.

The display panel DP may include pixels. Each of the pixels may include at least one transistor T1 and a light emitting element OL. FIG. 1 illustrates a region in which one transistor T1 and one light emitting element OL of the pixels of the display panel DP are disposed. Referring to FIG. 1, the display panel DP may include a base layer BL, a circuit element layer DP-CL, a display element layer DP-OL, and an encapsulation layer TFL.

The base layer BL may provide a base surface on which the circuit element layer DP-CL is disposed. The base layer BL may include a synthetic resin layer. After a synthetic resin layer is formed on a support substrate used in manufacturing the display panel DP, a conductive layer and an insulating layer may be formed on the synthetic resin layer. Thereafter, the support substrate may be removed, and the synthetic resin layer from which the support substrate is removed may correspond to the base layer BL.

At least one inorganic layer may be disposed on an upper surface of the base layer BL. The inorganic layer may form a barrier layer and/or a buffer layer. FIG. 1 illustrates a buffer layer BFL disposed on the base layer BL. The buffer layer BFL may improve a coupling force between the base layer BL and a semiconductor pattern of the circuit element layer DP-CL.

The circuit element layer DP-CL may be disposed on the buffer layer BFL. The circuit element layer DP-CL may include at least one insulating layer and a circuit element. The circuit element may include a signal line and a driving circuit of the pixel. The circuit element layer DP-CL may be formed by a process of forming an insulating layer, a semiconductor layer, and a conductive layer by coating or deposition, and a patterning process of the insulating layer, the semiconductor layer, and the conductive layer by photolithography.

In an embodiment, the circuit element layer DP-CL may include the transistor T1, a connection signal line SCL, connection electrodes CNE1 and CNE2, and insulating layers 10 20, 30, 40, 50, and 60. The insulating layers 10, 20, 30, 40, 50, and 60 may include first, second, third, fourth, fifth, and sixth insulating layers 10 20, 30, 40, 50, and 60 sequentially stacked on the buffer layer BFL. Each of the first, second, third, fourth, fifth, and sixth insulating layers 10 20, 30, 40, 50, and 60 may include at least one of an inorganic layer and an organic layer.

The transistor T1 may include a semiconductor pattern including a source area Sa, an active area Aa, and a drain area Da and a gate electrode Ga. The semiconductor pattern of the transistor T1 may include polysilicon. However, embodiments are not limited thereto, and the semiconductor pattern of the transistor T1 may include amorphous silicon or metal oxide.

The semiconductor pattern may be divided into areas according to conductivity. For example, electrical properties of the semiconductor pattern may vary according to whether the semiconductor pattern is doped or metal oxide is reduced. An area having high conductivity in the semiconductor pattern may function as an electrode or a signal line, e.g., the source area Sa and the drain area Da of the transistor T1. A non-doped or non-reduced area with relatively low conductivity may be the active area Aa (or a channel area) of the transistor T1.

The connection signal line SCL may be formed from a semiconductor pattern. The connection signal line SCL and the source area Sa, the active area Aa, and the drain area Da of the transistor T1 may be disposed on the same layer (e.g., buffer layer BFL). According to an embodiment, the connection signal line SCL may be electrically connected to the drain area Da of the transistor T1 in a plan view.

The first insulating layer 10 may cover the semiconductor pattern of the transistor T1. The gate electrode Ga may be disposed on the first insulating layer 10. The gate electrode Ga may overlap the active area Aa in a plan view. The gate electrode Ga may function as a mask in a process of doping the semiconductor pattern. An upper electrode UE may be disposed on the second insulating layer 20. The upper electrode UE may overlap the gate electrode Ga in a plan view.

The first connection electrode CNE1 and the second connection electrode CNE2 may be disposed between the transistor T1 and the light emitting element OL to electrically connect the transistor T1 and the light emitting element OL. The first connection electrode CNE1 may be disposed on the third insulating layer 30 and may be connected to the connection signal line SCL through a contact hole CNT-1 penetrating the first, second, and third insulating layers 10, 20, and 30. The second connection electrode CNE2 may be disposed on the fifth insulating layer 50 and may be connected to the first connection electrode CNE1 through a contact hole CNT-2 penetrating the fourth and fifth insulating layers 40 and 50.

The display element layer DP-OL may be disposed on the circuit element layer DP-CL. The display element layer DP-OL may include the light emitting element OL and a pixel defining layer PDL. The light emitting element OL may include a first electrode AE, a hole control layer HCL, an emission layer EML, an electron control layer ECL, and a second electrode CE.

The first electrode AE and the pixel defining layer PDL may be disposed on the sixth insulating layer 60. The first electrode AE may be connected to the second connection electrode CNE2 through a contact hole CNT-3 penetrating the sixth insulating layer 60. The pixel defining layer PDL may define a light emitting opening OP-PX exposing at least a portion of the first electrode AE, and the portion of the first electrode AE exposed by the light emitting opening OP-PX may correspond to a light emitting area PXA. A non-light emitting area NPXA may surround the light emitting area PXA.

The hole control layer HCL and the electron control layer ECL may be commonly disposed in the light emitting area PXA and the non-light emitting area NPXA. The emission layer EML may be formed in a pattern shape to correspond to the light emitting opening OP-PX. The patterned emission layer EML may be formed by using the deposition apparatus ED (refer to FIG. 2) according to an embodiment.

Compared to the hole control layer HCL and the electron control layer ECL in the form of a layer, the emission layer EML may be deposited in a different manner. For example, the hole control layer HCL and the electron control layer ECL may be commonly formed in the pixels by using a mask referred to as an open mask. The emission layer EML may be formed differently according to the pixels by using a mask referred to as a fine metal mask (FMM).

The encapsulation layer TFL may include thin layers. The encapsulation layer TFL according to an embodiment may include sequentially stacked first, second, and third thin layers EN1, EN2, and EN3. Each of the first, second, and third thin layers EN1, EN2, and EN3 may include at least one of an inorganic layer and an organic layer. The inorganic layer may protect the light emitting element OL from moisture and/or oxygen. The organic layer may protect the light emitting element OL from foreign substances such as dust particles. However, as long as the light emitting element OL is protected or light output efficiency is improved, the configuration of the encapsulation layer TFL is not limited thereto.

Figure 2:
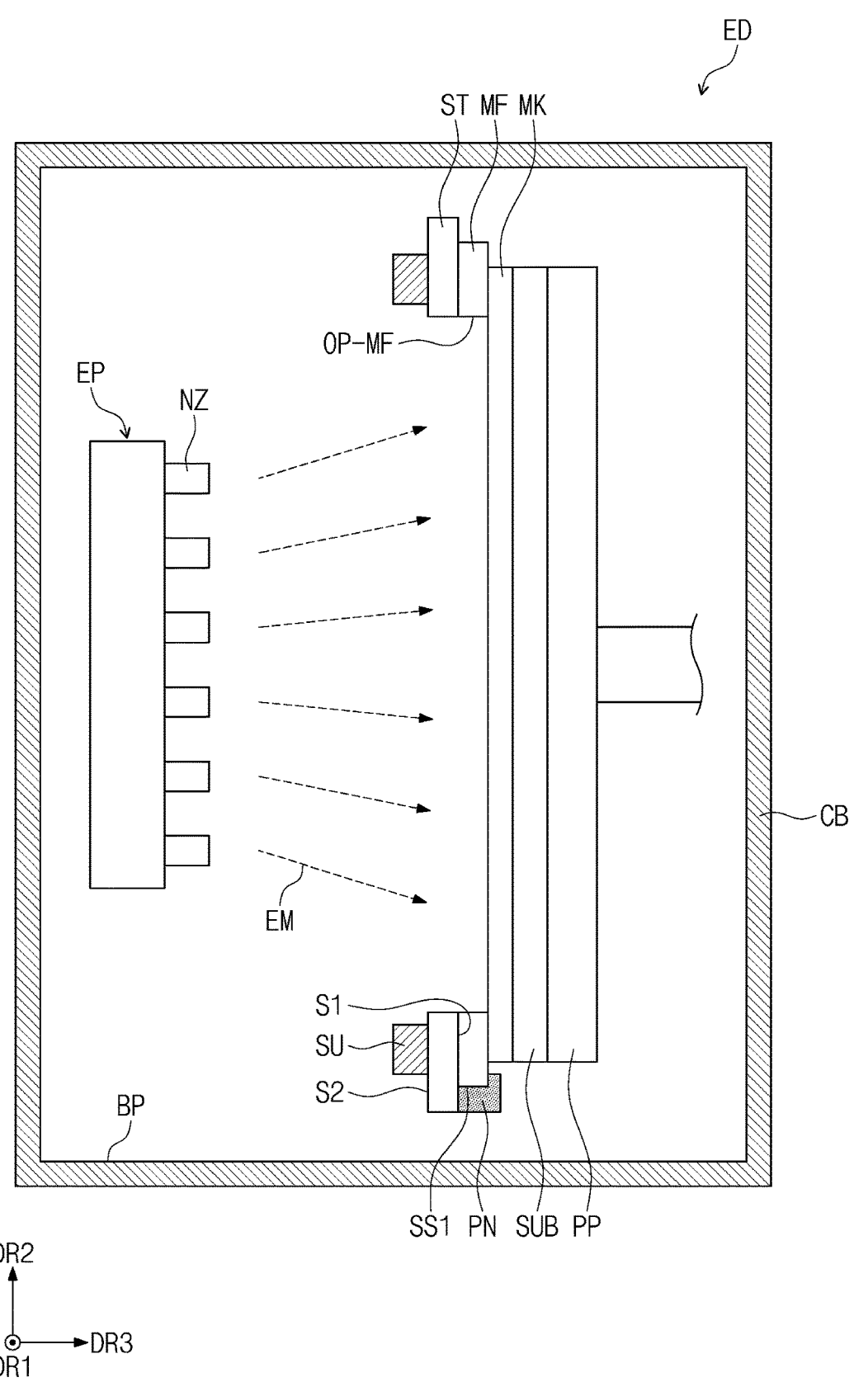
FIG. 2 is a schematic cross-sectional view of a deposition apparatus according to an embodiment.

FIG. 2 is a schematic cross-sectional view of a deposition apparatus ED according to an embodiment.

Referring to FIG. 2, the deposition apparatus ED may include a chamber CB, a deposition member EP, a fixing member PP, a mask MK, a mask frame MF, a stage ST, a pin unit PN, and a support unit SU. The deposition apparatus ED may further include additional mechanical devices for implementing an in-line system.

The chamber CB may provide an internal space, and the deposition member EP, the fixing member PP, the mask MK, the mask frame MF, the stage ST, the pin unit PN, and the support unit SU may be disposed in the internal space of the chamber CB. The chamber CB may provide a closed space to set a deposition condition to vacuum. The chamber CB may include at least one gate, and the chamber CB may be opened and closed by the gate. The mask MK, the mask frame MF, and a substrate SUB may enter and exit through the gate provided (or disposed) in the chamber CB.

The chamber CB may include a bottom surface BP, a ceiling surface, and sidewalls. The bottom surface BP of the chamber CB may be parallel to a plane defined by a first direction DR1 and a third direction DR3, and a normal direction of the bottom surface BP of the chamber CB may be parallel to a second direction DR2. In the descriptions, "in a plan view" is set based on a plane parallel to a plane defined by the first direction DR1 and the second direction DR2.

The fixing member PP may be disposed on the deposition member EP inside of the chamber CB. The fixing member PP may fix the substrate SUB on the mask MK. The fixing member PP may include a jig or a robot arm that holds the mask MK. The fixing member PP may include magnetic materials for adhering the mask MK and the substrate SUB to each other. For example, the magnetic materials may fix the mask MK by generating a magnetic force, and may guide the substrate SUB disposed between the mask MK and the fixing member PP into close contact with the mask MK.

The substrate SUB may be a processing object on which a deposition material is deposited. The substrate SUB may include a support substrate and a synthetic resin layer disposed on the support substrate. The support substrate may be removed in a manufacturing process of the display panel, and the synthetic resin layer may correspond to the base layer BL of FIG. 1. According to the configuration formed by the deposition process, the substrate SUB may include the base layer BL (refer to FIG. 1) and some elements of the display panel DP (refer to FIG. 1) formed on the base layer BL (refer to FIG. 1).

The deposition member EP may face the fixing member PP inside of the chamber CB. The deposition member EP may include a space accommodating a deposition material EM and at least one nozzle NZ. The deposition material EM may include an inorganic material, a metal, or an organic material capable of sublimation or vaporization. For example, the deposition material EM may include an organic light emitting material for forming the emission layer EML (refer to FIG. 1). However, the deposition material EM is not limited to the above example. The sublimated or vaporized deposition material EM may be sprayed toward the substrate SUB through the nozzle NZ. The deposition material EM may pass through the mask MK and be deposited on the substrate SUB to form a certain pattern.

The stage ST may be disposed between the deposition member EP and the fixing member PP. The stage ST may support a rear surface of the mask frame MF and may be disposed outside of a path of the deposition material EM supplied from the deposition member EP to the substrate SUB.

The stage ST may include a seating surface S1 on which the mask frame MF is seated (or disposed) and a rear surface S2 opposite to the seating surface S1. Each of the seating surface S1 and the rear surface S2 of the stage ST may be a surface parallel to the first direction DR1 and the second direction DR2. The seating surface S1 of the stage ST may be provided substantially perpendicular to the bottom surface BP of the chamber CB. Accordingly, the rear surface of each of the mask frame MF and the mask MK disposed on the seating surface S1 of the stage ST may be provided (or disposed) substantially perpendicular to the bottom surface BP of the chamber CB to perform the deposition process. Accordingly, the mask MK having a large-area may be prevented from descending and a deflection of the mask MK due to gravity, and deposition reliability by using the deposition apparatus ED may be improved.

However, embodiments are not limited thereto. In another example, the seating surface S1 of the stage ST may be provided (or disposed) substantially parallel to the bottom surface BP of the chamber CB, and rear surface of each of the mask frame MF and the mask MK may be provided (or disposed) substantially parallel to the bottom surface BP of the chamber CB, and the deposition process may be performed.

The mask MK may include deposition openings defining (or overlapping) a deposition region. The mask frame MF may be coupled to the mask MK to support the mask MK. The mask frame MF may include an upper surface facing the mask MK, a rear surface (or lower surface) opposite to the upper surface and facing the seating surface S1 of the stage ST, and side surfaces connecting the upper surface and the rear surface. The mask frame MF may include portions defining (or forming) an opening (e.g., frame opening) OP-MF overlapping the deposition openings of the mask MK. For example, the mask frame MF may have a frame shape surrounding the opening OP-MF in a plan view. A detailed description thereof will be provided below.

The pin unit PN may be connected to the stage ST to support the mask frame MF. The pin unit PN may be disposed below the stage ST in a plan view and disposed adjacent to a side of the stage ST parallel to the first direction DR1. The pin unit PN may face a side surface SS1 of the mask frame MF in the second direction DR2 and may support the side surface SS1 of the mask frame MF. In an embodiment, the side surface SS1 of the mask frame MF supported by the pin unit PN may face the bottom surface BP of the chamber CB. For example, the pin unit PN may support the mask frame MF vertically seated (or disposed) in the chamber CB. The pin unit PN may be moved in a direction parallel to the second direction DR2 by a pin position controller, and accordingly, force applied to the mask frame MF by the pin unit PN may be adjusted.

The support unit SU may be disposed on the rear surface S2 of the stage ST to fix the mask frame MF on the seating surface S1 of the stage ST. The support unit SU may be adjusted, and thus a position at which the mask frame MF is seated (or disposed) and a force applied to the mask frame MF may be adjusted. The support unit SU may include a magnet unit and an adjustable block disposed on the rear surface S2 of the stage ST, and a detailed description thereof will be described below.

Figure 3A:
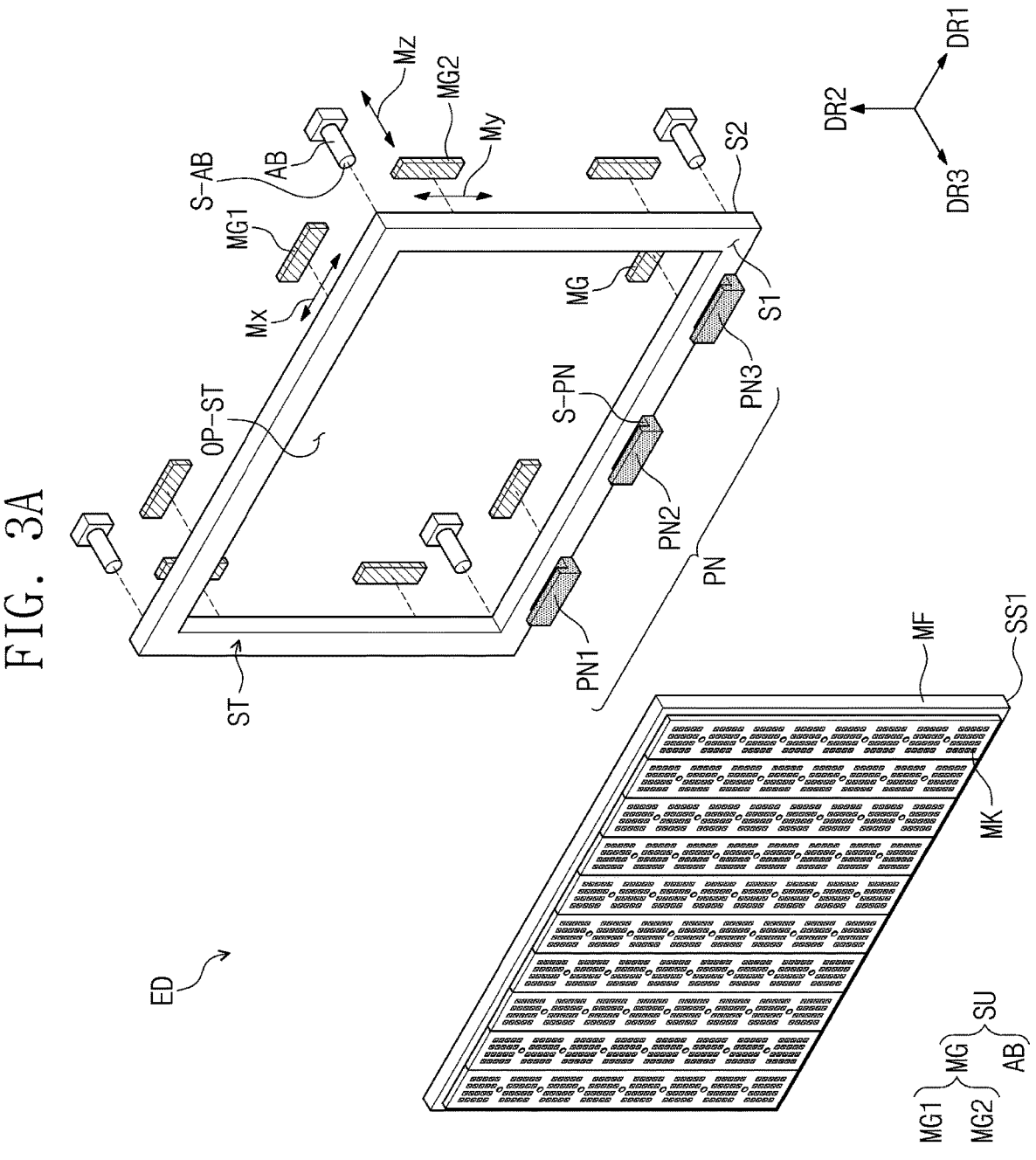
FIG. 3A is a schematic exploded perspective view of a deposition apparatus according to an embodiment.
Figure 3B:
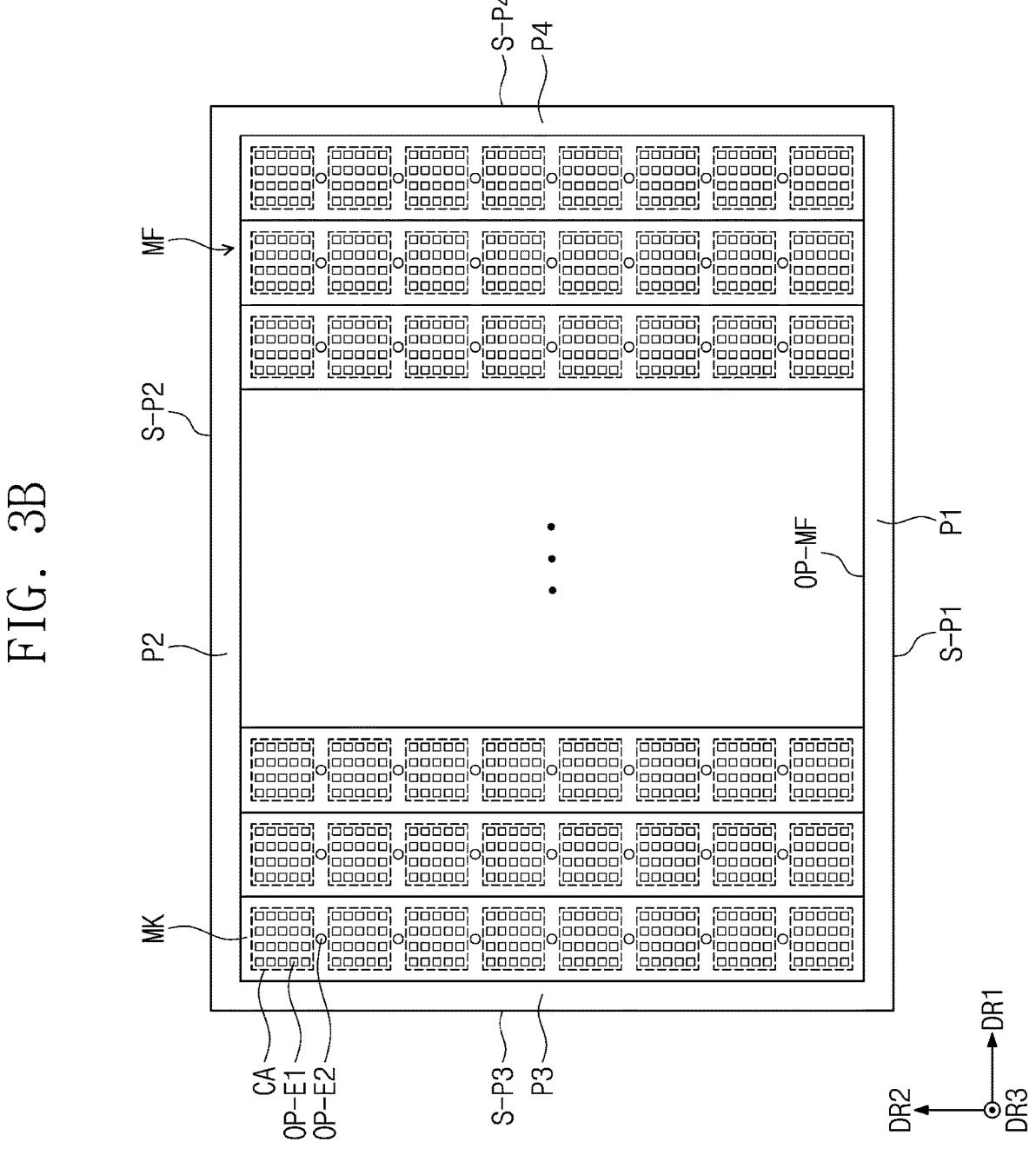
FIG. 3B is a schematic plan view of a mask and a mask frame according to an embodiment.

FIG. 3A is a schematic exploded perspective view of a deposition apparatus ED according to an embodiment. FIG. 3B is a schematic plan view of a mask MK and a mask frame MF according to an embodiment. FIG. 3B illustrates a plan view of the mask MK and the mask frame MF as viewed from a top of the mask frame MF. With respect to each configuration of the deposition apparatus ED shown in FIGS. 3A and 3B, the above description may be equally applied.

Referring to FIGS. 3A and 3B, the mask frame MF may provide a support surface on which the mask MK may be disposed. A surface on which the mask MK is disposed may be the upper surface of the mask frame MF, and a surface facing the upper surface and facing the seating surface S1 of the stage ST may be the rear surface of the mask frame MF.

The mask frame MF may have a rigidity. For example, the mask frame MF may include a metal material such as stainless steel (SUS), an Invar® alloy, nickel (Ni), or cobalt (Co).

The mask frame MF may have a rectangular closed line shape in a plan view. The mask frame MF may include portions P1, P2, P3, and P4 forming the opening OP-MF. The portions P1, P2, P3, and P4 may be integral with each other to surround the opening OP-MF, and may form a single mask frame MF. Each of the first portion P1 and the second portion P2 may extend in the first direction DR1, and each of the third portion P3 and the fourth portion P4 may extend in the second direction DR2.

The portions P1, P2, P3, and P4 each include side surfaces S-P1, S-P2, S-P3, and S-P4 defining an outer surface of the mask frame MF. The side surface SS1 of the mask frame MF described above with reference to FIG. 2 may be one of the side surfaces S-P1, S-P2, S-P3, and S-P4 of the portions P1, P2, P3, and P4. In an embodiment, the side surface SS1 is illustrated as corresponding to the side surface 5-P1 of the first portion P1, but embodiments are not limited thereto.

The mask MK may be provided as the plural, and each mask MK may be disposed on a mask frame MF. The masks MK may be coupled and fixed on the mask frame MF. For example, the masks MK may overlap the opening OP-MF of the mask frame MF and may be coupled to each other in a state where the masks MK are arranged in the first direction DR1.

Each of the masks MK may extend in the second direction DR2. For example, each of the masks MK may have short sides extending in the first direction DR1 and long sides extending in the second direction DR2. However, the extension directions of the masks MK are not limited thereto.

Each of the masks MK may be a thin plate having a thickness thinner than that of the mask frame MF. Each of the masks MK may include a metal material such as stainless steel (SUS), an Invar® alloy, nickel (Ni), or cobalt (Co). However, the material of the masks MK is not limited to the above example.

Each of the masks MK may include at least one cell area CA. FIG. 3B illustrates an embodiment in which each of the masks MK includes cell areas CA. Within a mask MK, the cell areas CA may be spaced apart from each other in the second direction DR2. The cell areas CA of the masks MK arranged in the first direction DR1 may be spaced apart from each other in the first direction DR1. The area of a cell area CA may substantially correspond to the area of a display panel DP (refer to FIG. 1). However, the number of cell areas CA shown in FIG. 3B is an example, and the number of cell areas CA may vary according to the area of the mask MK and the area of a deposition target, and embodiments are not limited thereto.

Deposition openings OP-E1 and OP-E2 may be formed in each of the masks MK. Each of the deposition openings OP-E1 and OP-E2 may be formed to penetrate the masks MK in a thickness direction of the masks MK (e.g., the third direction DR3). The deposition openings OP-E1 and OP-E2 may include first deposition openings (or cell deposition openings) OP-E1 formed in the cell area CA of the mask MK and second deposition openings (or alignment deposition openings) OP-E2 formed in an area other than the cell area CA of the mask MK.

The first deposition openings OP-E1 formed in each of the cell areas CA may be spaced apart from each other and may have a certain arrangement. The first deposition openings OP-E1 may have a rectangular shape in a plan view. However, the shape of the first deposition openings OP-E1 is not limited thereto, and the shape of the first deposition openings OP-E1 may vary, such as a rhombus or a circle. The number, shape, and arrangement of the first deposition openings OP-E1 formed in each of the cell area CA shown in FIGS. 3A and 3B may be examples and may vary according to a deposition pattern to be formed. Embodiments are not limited thereto.

The deposition material EM (refer to FIG. 2) passing (or spraying) through the first deposition openings OP-E1 may be deposited on the substrate SUB (refer to FIG. 2) to form deposition patterns corresponding to the shape and arrangement of the first deposition openings OP-E1. In an embodiment, the deposition patterns may correspond to the emission layer EML (refer to FIG. 1) of the display panel DP (refer to FIG. 1). However, as long as a layer is formed by deposition in the display panel DP (refer to FIG. 1), but embodiments are not limited thereto.

The second deposition openings (or alignment deposition openings) OP-E2 may be formed between the cell areas CA. Although FIG. 3B illustrates that the second deposition openings OP-E2 are formed in regions between the cell areas CA spaced apart in the second direction DR2, embodiments are not limited thereto. For example, the second deposition openings OP-E2 may not be formed between each of the cell areas CA, but may be partially formed therebetween, or may be formed adjacent to corner portions of the cell areas CA.

The second deposition openings OP-E2 may have a circular shape in a plan view. However, the shape of the second deposition openings OP-E2 is not limited thereto, and the shape of the second deposition openings OP-E2 may vary, such as a rectangle or a rhombus.

The deposition material EM (refer to FIG. 2) passing (or spraying) through the second deposition openings OP-E2 may be deposited on the substrate SUB (refer to FIG. 2) to form the deposition patterns corresponding to the shape and arrangement the second deposition openings OP-E2. In an embodiment, the deposition patterns formed through the second deposition openings (or alignment deposition openings) OP-E2 may be referred to as alignment patterns. The alignment patterns may be used to verify (or check) accuracy of formation positions of the deposition patterns. For example, it is possible to predict whether the deposition patterns are formed at designed positions by using positions where the alignment patterns are formed. For example, the mask frame MF may be rearranged on the stage ST by using the positions where the alignment patterns are formed.

Referring to FIG. 3A, the stage ST may include the seating surface S1 on which the mask frame MF is seated (or disposed) and the rear surface S2 opposite to the seating surface S1. The seating surface S1 of the stage ST may support the rear surface of the mask frame MF. The stage ST may have a shape corresponding to the shape of the mask frame MF. For example, the stage ST may have a frame shape in which a stage opening OP-ST overlapping the opening OP-MF of the mask frame MF is defined. In an embodiment, although the stage ST has a rectangular annular shape including long sides extending in the first direction DR1 and short sides extending in the second direction DR2 in a plan view, the shape of the stage ST is not limited thereto as long as the rear surface of the mask frame MF is supported.

The pin unit PN may include pins PN1, PN2, and PN3. The first, second, and third pins PN1, PN2, and PN3 may include first, second, and third pins PN1, PN2, and PN3. However, the number of pins PN1, PN2, and PN3 illustrated in FIG. 3A is an example, and the number of pins PN1, PN2, and PN3 included in the deposition apparatus ED may be less or more than illustrated.

Each of the first, second, and third pins PN1, PN2, and PN3 may be connected to the stage ST. Each of the first, second, and third pins PN1, PN2, and PN3 may be disposed on a lower part of the seating surface S1 of the stage ST, and may be disposed adjacent to a side of the stage ST parallel to the first direction DR1. The first, second, and third pins PN1, PN2, and PN3 may be spaced apart from each other in the first direction DR1.

Each of the first, second, and third pins PN1, PN2, and PN3 may include a support surface S-PN facing the side surface SS1 of the mask frame MF seated (or disposed) on the stage ST and supporting the side surface SS1 of the mask frame MF. According to an embodiment, the support surfaces S-PN of the first, second, and third pins PN1, PN2, and PN3 may face a side surface 5-P1 of the first portion P1 of the mask frame MF in the second direction DR2. For example, each of the first, second, and third pins PN1, PN2, and PN3 may apply an external force to the side surface 5-P1 of the first portion P1 in the second direction DR2 to support the mask frame MF.

Each of the first, second, and third pins PN1, PN2, and PN3 may move in parallel to a direction facing the side surface SS1 of the mask frame MF supported by the first, second, and third pins PN1, PN2, and PN3. For example, in an embodiment, each of the first, second, and third pins PN1, PN2, and PN3 may move in a direction parallel to the second direction DR2. Hereinafter, in an embodiment, the moving direction of the first, second, and third pins PN1, PN2, and PN3 may be defined as an up-down direction My. As the first, second, and third pins PN1, PN2, and PN3 move in the up-down direction My, positions of the support surfaces S-PN of the first, second, and third pins PN1, PN2, and PN3 may move.

The movement of the first, second, and third pins PN1, PN2, and PN3 may be adjusted independently of each other by the pin position controller. As the first, second, and third pins PN1, PN2, and PN3 move independently of each other, positions of some of the first, second, and third pins PN1, PN2, and PN3 in the second direction DR2 may be different from each other. For example, the support surfaces S-PN of some of the first, second, and third pins PN1, PN2, and PN3 may have different positions. As the positions of the first, second, and third pins PN1, PN2, and PN3 are adjusted, the external force applied by each of the first, second, and third pins PN1, PN2, and PN3 to the side surface SS1 of the mask frame MF may be adjusted. The first, second, and third pins PN1, PN2, and PN3 may move, and thus the positions of the mask frame MF seated (or disposed) on the stage ST may be aligned, thereby improving accuracy of the positions of the mask frame MF where the deposition patterns are formed.

FIG. 3A illustrates the shapes of the first, second, and third pins PN1, PN2, and PN3, but the shape of the pins PN1, PN2, and PN3 is not limited thereto as long as the shape of the pins PN1, PN2, and PN3 supports the side surface SS1 of the mask frame MF and each position of the first, second, and third pins PN1, PN2, and PN3 is adjusted.

Referring to FIG. 3A, the support unit SU may include a magnet unit MG and an adjustable block AB disposed on the rear surface S2 of the stage ST.

The magnet unit MG may include electro permanent magnets MG1 and MG2. The electro permanent magnets MG1 and MG2 may be provided (or disposed) at various positions in a region overlapping the mask frame MF of the rear surface S2 of the stage ST. The first electro permanent magnets MG1 may be disposed on a portion of the stage ST that extends in the first direction DR1. The second electro permanent magnets MG2 may be disposed on a portion of the stage ST extending in the second direction DR2. However, the number and arrangement of the electro permanent magnets MG1 and MG2 shown in FIG. 3A are examples and not limited thereto.

Magnetic force of the electro permanent magnets MG1 and MG2 may be adjusted according to whether electric energy is applied. For example, the electro permanent magnets MG1 and MG2 may maintain their magnetic force in case that no electric energy is applied, and the magnetic force of the electro permanent magnets MG1 and MG2 may be removed in case that electric energy is applied. However, the embodiment of the magnet unit MG is not limited thereto as long as the magnet unit MG has the magnetic force and is capable of fixing the mask frame MF on the stage ST.

Each of the electro permanent magnets MG1 and MG2 may be attached on the rear surface S2 of the stage ST and may generate the magnetic force to fix the mask frame MF on the seating surface S1 of the stage ST. For example, each of the electro permanent magnets MG1 and MG2 may apply an attractive force to the mask frame MF in the third direction DR3. The electro permanent magnets MG1 and MG2 may prevent the position of the mask frame MF from being moved or deformed by gravity.

Each of the electro permanent magnets MG1 and MG2 may be moved in a direction on the rear surface S2 of the stage ST by a magnet position controller. The first electro permanent magnet MG1 may move in a direction parallel to the first direction DR1, and the second electro permanent magnet MG2 may move in a direction parallel to the second direction DR2. Hereinafter, in an embodiment, a moving direction of the first electro permanent magnet MG1 may be defined as a left-right direction Mx, and a moving direction of the second electro permanent magnet MG2 may be defined as the up-down direction My.

Each of the first electro permanent magnet MG1 and the second electro permanent magnet MG2 may be provided as the plural. Each of the first electro permanent magnets MG1 may be spaced apart from each other, and may be independently adjusted. For example, each of the first electro permanent magnets MG1 may be moved independently of each other in the left-right direction Mx by the magnet position controller. For example, the second electro permanent magnets MG2 may be spaced apart from each other, and may be moved independently in the up-down direction My by the magnet position controller.

The positions of the electro permanent magnets MG1 and MG2 may be adjusted, and thus a position of a region to which the attractive force is applied on the rear surface of the mask frame MF may be adjusted. The electro permanent magnets MG1 and MG2 may move, and thus the positions of the mask frame MF seated (or disposed) on the stage ST may be finely (or precisely) aligned, thereby improving the accuracy of the positions where the deposition patterns are formed.

The adjustable block AB may be provided as the plural. The adjustable blocks AB may be spaced apart from the magnet unit MG on the rear surface S2 of the stage ST. The adjustable blocks AB may be provided (or disposed) at various positions in a region overlapping the mask frame MF of the rear surface S2 of the stage ST. For example, each of the adjustable blocks AB may be disposed on a region adjacent to each corner portion of the mask frame MF. However, the number and arrangement of the adjustable blocks AB shown in FIG. 3A are not limited thereto.

Each of the adjustable blocks AB may include a first surface S-AB that supports the rear surface S2 of the stage ST. The first surface S-AB of each of the adjustable blocks AB may face the rear surface S2 of the stage ST in the third direction DR3. Each of the adjustable blocks AB may apply an external force to the stage ST and the mask frame MF in the third direction DR3 to support the stage ST and the mask frame MF.

A length of each of the adjustable blocks AB may be adjusted in parallel to a direction in which the first surface S-AB faces the rear surface S2 of the stage ST by an adjustable block length controller. For example, the length of each of the adjustable blocks AB may be adjusted in the third direction DR3 by the adjustable block length controller. In an embodiment, the direction in which the lengths of the adjustable blocks AB are adjusted may be defined as a front-rear direction Mz. The lengths of the adjustable blocks AB may be adjusted in the front-rear direction Mz by the adjustable block length controller, and thus positions of the first surfaces S-AB of the adjustable blocks AB may move.

The lengths of the adjustable blocks AB may be adjusted independently of each other by the adjustable block length controller. Accordingly, some of the adjustable blocks AB may have different lengths. For example, positions of the first surfaces S-AB of the adjustable blocks AB in the third direction DR3 may be different from each other. In case that the length of the adjustable block AB increases, the external force applied by the first surface S-AB of the adjustable block AB, to the rear surface S2 of the stage ST and the rear surface of the mask frame MF in the third direction DR3 may increase. In case that the length of the adjustable block AB decreases, the external force applied by the first surface S-AB of the adjustable block AB, to the rear surface S2 of the stage ST and the rear surface of the mask frame MF in the third direction DR3 may decrease. According to an embodiment, the first surface S-AB of the adjustable block AB may be spaced apart from the rear surface S2 of the stage ST.

Tensile or compressive force may act within the mask frame MF according to a manufacturing process or a material for forming the mask frame MF, and accordingly, the mask frame MF may be slightly deformed. For example, in the vertical deposition process, the deposition patterns may be non-uniformly formed by gravity applied to the mask frame MF and the mask MK. According to an embodiment, the length of each of the adjustable blocks AB may be adjusted, and thus the external force may be applied to a specific region of the mask frame MF in the third direction DR3. Accordingly, contraction or expansion of the mask frame MF in the first direction DR1 or the second direction DR2 may be compensated, and the deposition accuracy deterioration caused by the deformation of the mask frame MF may be minimized.

Figure 4A:
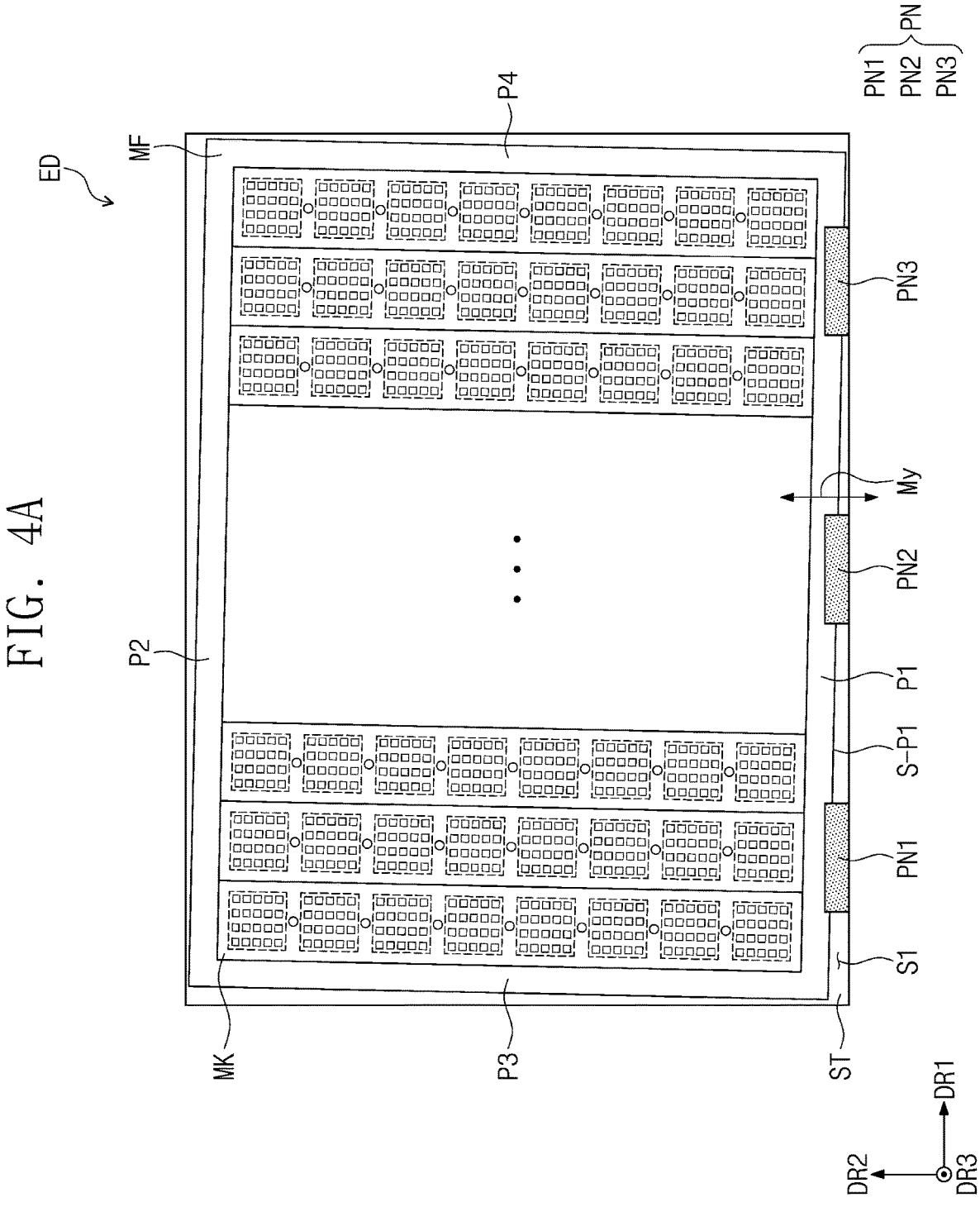
FIGS. 4A and 4B are schematic plan views of a deposition apparatus according to an embodiment.
Figure 4B:
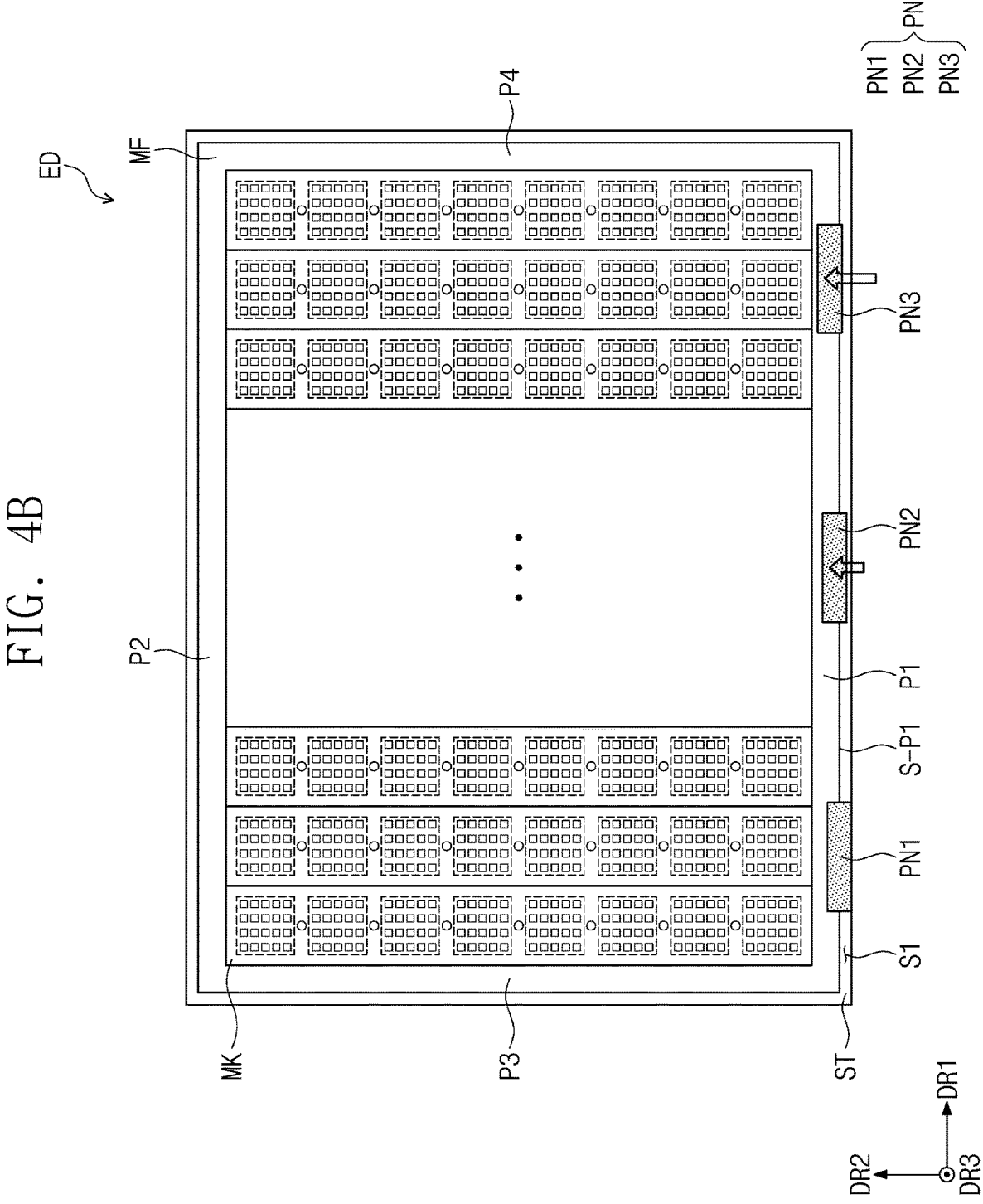

FIGS. 4A and 4B are schematic plan views of a deposition apparatus ED according to an embodiment. Each of FIGS. 4A and 4B is a schematic plan view of a configuration of the deposition apparatus ED viewed from the seating surface S1 of the stage ST. With respect to each configuration shown in FIGS. 4A and 4B, the above description may be equally applied, and a repeated description will be omitted below.

In a process of seating the mask frame MF to which the mask MK is coupled on the stage ST, the mask frame MF may not be properly seated (or disposed) at an accurate position. FIG. 4A illustrates the mask frame MF that is not properly seated (or disposed). Referring to FIG. 4A, the mask frame MF may be seated (or disposed) to be downwardly inclined to a right in a plan view. In case that the mask frame MF is not seated (or disposed) at a required position, deposition accuracy may be deteriorated.

Referring to FIG. 4A, each of the first, second, and third pins PN1, PN2, and PN3 included in the pin unit PN may support the side surface 5-P1 of the first portion P1 of the mask frame MF. The first, second, and third pins PN1, PN2, and PN3 may be sequentially disposed in the first direction DR1. For example, when viewed from the seating surface S1 of the stage ST, among the first, second, and third pins PN1, PN2, and PN3, the second pin PN2 may be disposed at a center portion of the long side of the stage ST, the first pin PN1 may be disposed on a left portion of the long side of the stage ST (e.g., a left side with respect to the second pin PN2), and the third pin PN3 may be disposed on a right portion of the long side of the stage ST (e.g., a right side with respect to the second pin PN2). Accordingly, the first pin PN1 may support a left portion of the side surface 5-P1 of the first portion P1, the second pin PN2 may support a center portion of the side surface 5-P1 of the first portion P1, and the third pin PN3 may support a right portion of the side surface 5-P1 of the first portion P1.

The first, second, and third pins PN1, PN2, and PN3 may be moved independently of each other in the up-down direction My by the pin position controller. The first, second, and third pins PN1, PN2, and PN3 may move respectively, and thus the external force applied to the side surface S-P1 of the first portion P1 may be adjusted according to a region supported by the first, second, and third pins PN1, PN2, and PN3. FIG. 4B illustrates that the pin unit PN is adjusted and the mask frame MF is disposed at the required position.

The positions of the first, second, and third pins PN1, PN2, and PN3 may be adjusted based on a degree to which the mask frame MF is deviated in a plan view. Referring to FIG. 4B, the second pin PN2 disposed at the center portion of the long side of the stage ST and the third pin PN3 disposed on the right portion of the long side of the stage ST may move toward the side surface S-P1 of the first portion P1. Accordingly, each of the second pin PN2 and the third pin PN3 may further apply the external force to the side surface S-P1 of the first portion P1 in the second direction DR2. The third pin PN3 disposed on the right portion of the long side of the stage ST may move more toward the side surface 5-P1 of the first portion P1 than the second pin PN2 disposed at the center portion of the long side of the stage ST, based on the same reference plane. Accordingly, the largest external force may act on the right side of the side surfaces 5-P1 of the first portion P1 of the mask frame MF, and the mask frame MF downwardly inclined to the right may be aligned to the required position.

Whether the mask frame MF is seated (or disposed) in an accurate and required position may be determined by predicting the formation positions of the deposition patterns by using the positions of the deposition openings OP-E1 and OP-E2 (refer to FIG. 3B) of the mask MK disposed on the stage ST. Considering the deviation region and deviation degree between the formation positions of the predicted deposition patterns and the formation positions of the designed deposition patterns, the pin unit PN may be adjusted and thus the position of the mask frame MF may be adjusted.

As above-described, the positions of the first, second, and third pins PN1, PN2, and PN3 may be adjusted, and thus the seating position of the mask frame MF may be adjusted and the mask MK coupled to the mask frame MF may be adjusted. As the mask frame MF and the mask MK are aligned at required positions, deposition accuracy may be improved. For example, the positions of the first, second, and third pins PN1, PN2, and PN3 may be adjusted independently, and thus the seating position of the mask frame MF may be precisely adjusted.

Figure 5A:
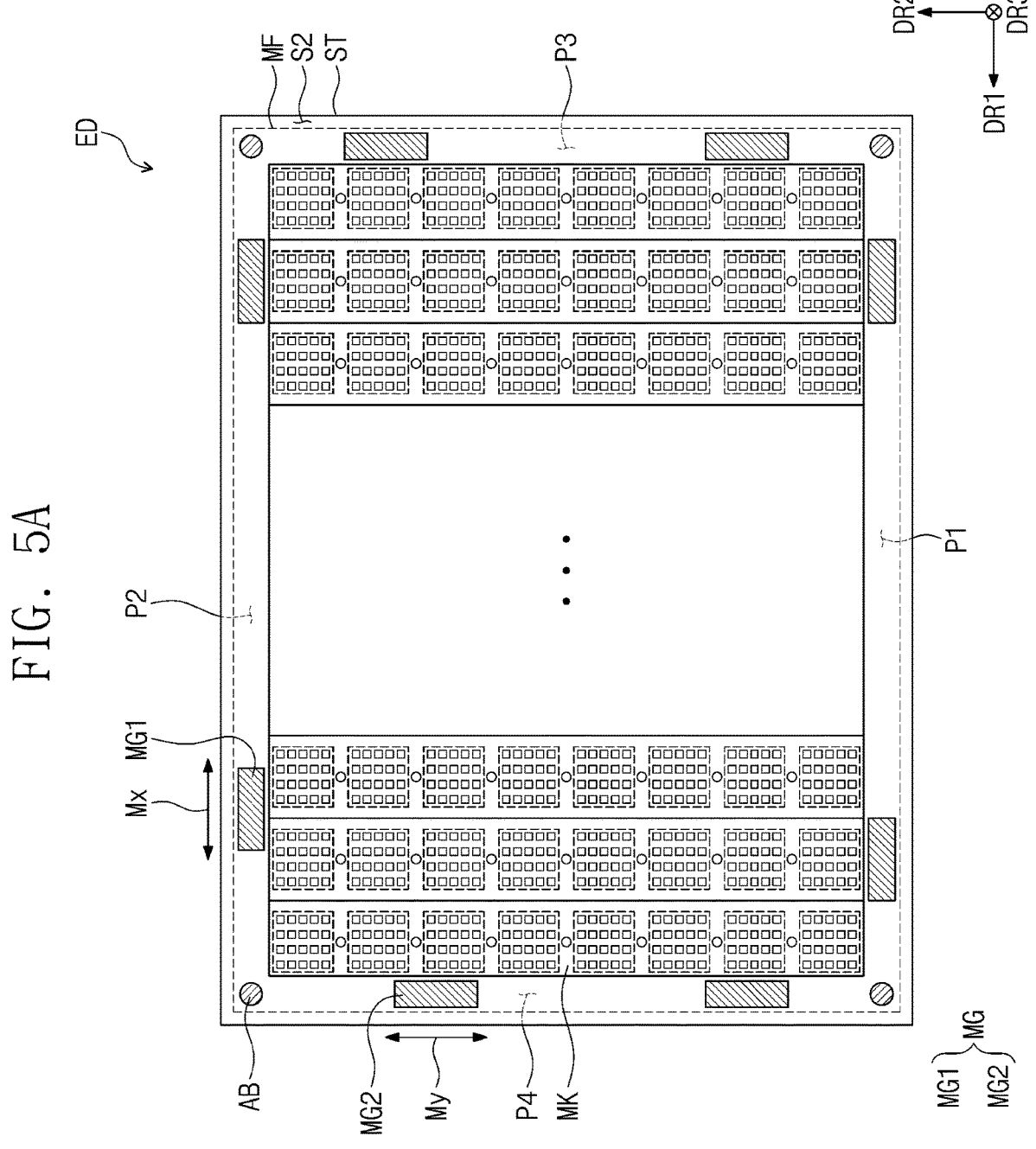
FIGS. 5A and 5B are schematic plan views of a deposition apparatus according to an embodiment.
Figure 5B:
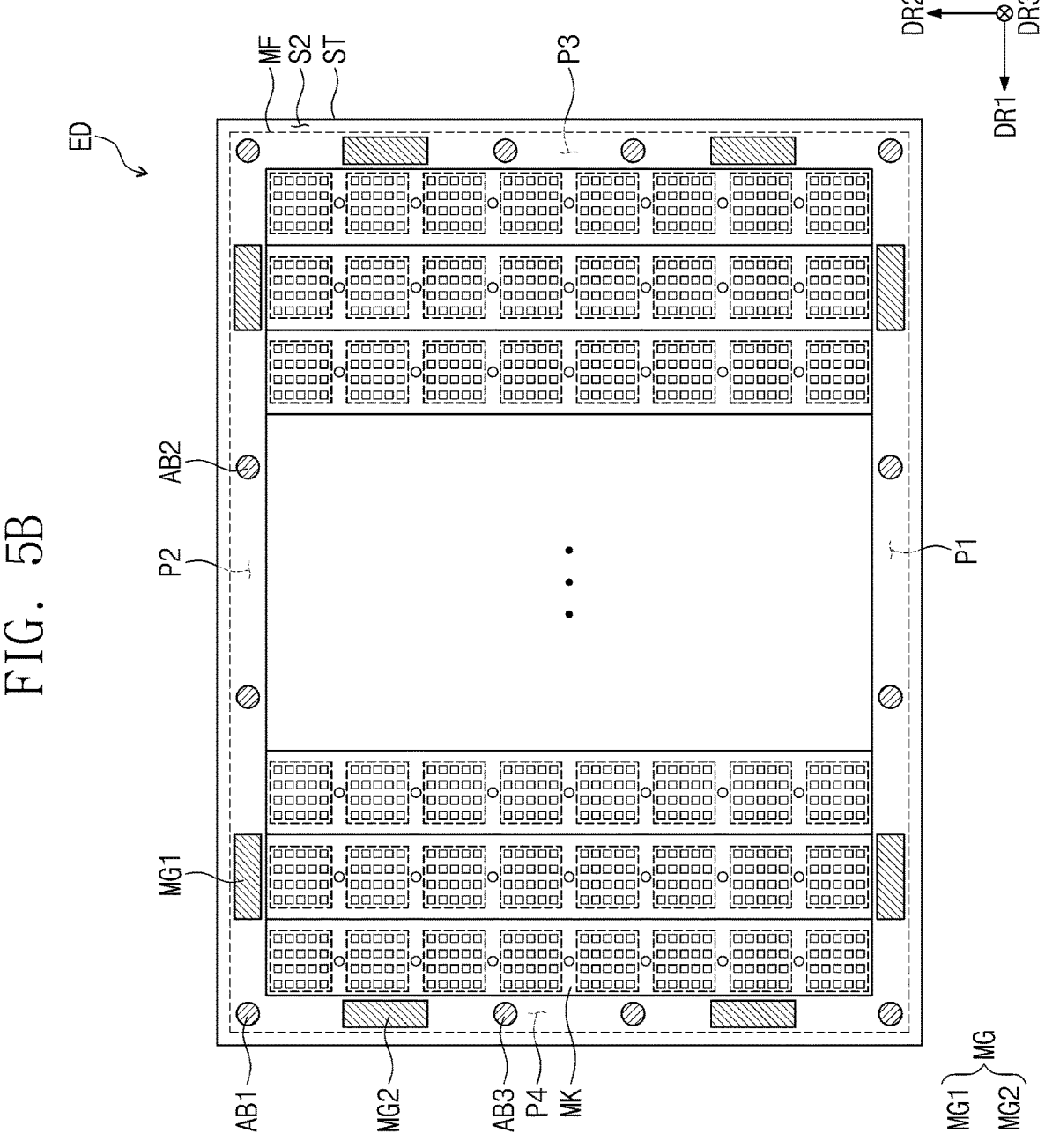

FIGS. 5A and 5B are schematic plan views of a deposition apparatus ED according to an embodiment. FIGS. 5A and 5B are schematic plan views of some configurations of the deposition apparatus ED as viewed from the rear surface S2 of the stage ST. FIGS. 5A and 5B illustrate a portion overlapping the mask frame MF on the rear surface S2 of the stage ST by a dotted line, for convenience of description.

The deposition apparatuses ED shown in FIGS. 5A and 5B include substantially the same configuration as the above-described, with some differences in the arrangement and number of the adjustable blocks AB. The above description may be equally applied to each of the components shown in FIGS. 5A and 5B, and the repeated description will be omitted below for convenience of description.

Referring to FIG. 5A, each of the first and second electro permanent magnets MG1 and MG2 included in the magnet unit MG may overlap the mask frame MF in a plan view. The first and second electro permanent magnets MG1 and MG2 may be arranged along the extension direction of the mask frame MF.

Each of the first electro permanent magnets MG1 may overlap the first portion P1 or the second portion P2 of the mask frame MF extending in the first direction DR1 in a plan view, and may move in the left-right direction Mx. The first electro permanent magnets MG1 may overlap the first portion P1 of the mask frame MF, and may be spaced apart from each other in the first direction DR1. The first electro permanent magnets MG1 overlapping the first portion P1 and the first electro permanent magnets MG1 overlapping the second portion P2 may be spaced apart from each other in the second direction DR2. Each of the first electro permanent magnets MG1 may move independently in the left-right direction Mx.

Each of the second electro permanent magnets MG2 may overlap the third portion P3 or the fourth portion P4 of the mask frame MF extending in the second direction DR2 in a plan view, and may move in the up-down direction My. The second electro permanent magnets MG2 may overlap the third portion P3 of the mask frame MF, and may be spaced apart from each other in the second direction DR2. The second electro permanent magnets MG2 overlapping the third portion P3 and the second electro permanent magnets MG2 overlapping the fourth portion P4 may be spaced apart from each other in the first direction DR1. Each of the second electro permanent magnets MG2 may independently move in the up-down direction My.

The adjustable blocks AB may be disposed in regions adjacent to corner portions of the mask frame MF on the rear surface S2 of the stage ST, respectively. For example, the adjustable blocks AB may be disposed on portions where portions of the mask frame MF having different extension directions are connected to each other. The first electro permanent magnets MG1 or the second electro permanent magnets MG2 may be disposed between the adjustable blocks AB on a plane. For example, the first electro permanent magnets MG1 spaced apart in the first direction DR1 may be disposed between the adjustable blocks AB overlapping the first portion P1. However, embodiments are not limited thereto, and an electro permanent magnet may be disposed between the adjustable blocks AB.

Referring to FIG. 5B, the deposition apparatus ED may include a first adjustable block AB1, a second adjustable block AB2, and a third adjustable block AB3 each which is provided as the plural. Each of the first, second, and third adjustable blocks AB1, AB2, and AB3 may be adjustable blocks having substantially the same structure, and may be different in an arrangement. The first, second, and third adjustable blocks AB1, AB2, and AB3 may be disposed in an extension direction of the mask frame MF.

The first adjustable blocks AB1 may be respectively disposed in regions adjacent to corner portions of the mask frame MF on the rear surface S2 of the stage ST. The description of the adjustable blocks AB of FIG. 5A may be equally applied to the first adjustable blocks AB1.

Each of the second adjustable blocks AB2 may overlap the first portion P1 or the second portion P2 of the mask frame MF extending in the first direction DR1 in a plan view. The second adjustable blocks AB2 may overlap the first portion P1, and may be spaced apart from each other in the first direction DR1. The second adjustable blocks AB2 overlapping the first portion P1 and the second adjustable blocks AB2 overlapping the second portion P2 may be spaced apart in the second direction DR2. The positions of the second adjustable blocks AB2 may be fixed in the first direction DR1.

Each of the third adjustable blocks AB3 may overlap the third portion P3 or the fourth portion P4 of the mask frame MF extending in the second direction DR2 in a plan view. The third adjustable blocks AB3 may overlap the third portion P3, and may be spaced apart from each other in the second direction DR2. The third adjustable blocks AB3 overlapping the third portion P3 and the third adjustable blocks AB3 overlapping the fourth portion P4 may be spaced apart in the first direction DR1. The positions of the third adjustable blocks AB3 may be fixed in the second direction DR2.

At least one first electro permanent magnet MG1 may be disposed between the first adjustable block AB1 and the second adjustable block AB2, and at least one second electro permanent magnet MG2 may be disposed between the first adjustable block AB1 and the third adjustable block AB3. According to an embodiment, the second adjustable blocks AB2 may be disposed between the first electro permanent magnets MG1 in a plan view, and the third adjustable blocks AB3 may be disposed between the second electro permanent magnets MG2. In the descriptions, the second adjustable blocks AB2 disposed in the first direction DR1 may be referred to as a first group of adjustable blocks, and the third adjustable blocks AB3 disposed in the second direction DR2 may be referred to as a second group of adjustable blocks. In case that the deposition apparatus ED includes the first group of adjustable blocks and the second group of adjustable blocks, the first adjustable blocks AB1 may be omitted. However, the number and arrangement of the first, second, and third adjustable blocks AB1, AB2, and AB3 and the first and second electro permanent magnets MG1 and MG2 are not limited thereto.

The lengths of the first, second, and third adjustable blocks AB1, AB2, and AB3 may be independently adjusted. For example, the lengths of the first, second, and third adjustable blocks AB1, AB2, and AB3 may be adjusted in the front-rear directions Mz (refer to FIG. 3A) parallel to the third direction DR3, respectively. Accordingly, an external force applied to the mask frame MF may be adjusted on regions supported by each of the first, second, and third adjustable blocks AB1, AB2, and AB3, independently.

However, the number and arrangement of adjustable blocks included in the deposition apparatus ED are not limited to those illustrated in FIGS. 5A and 5B. As the number of adjustable blocks arranged in the extension direction of the mask frame MF increases, the external force applied to the mask frame MF by the adjustable blocks AB may be finely (or precisely) adjusted, and as the number of adjustable blocks decreases, the structure of the deposition apparatus ED may be simplified.

Figure 6A:
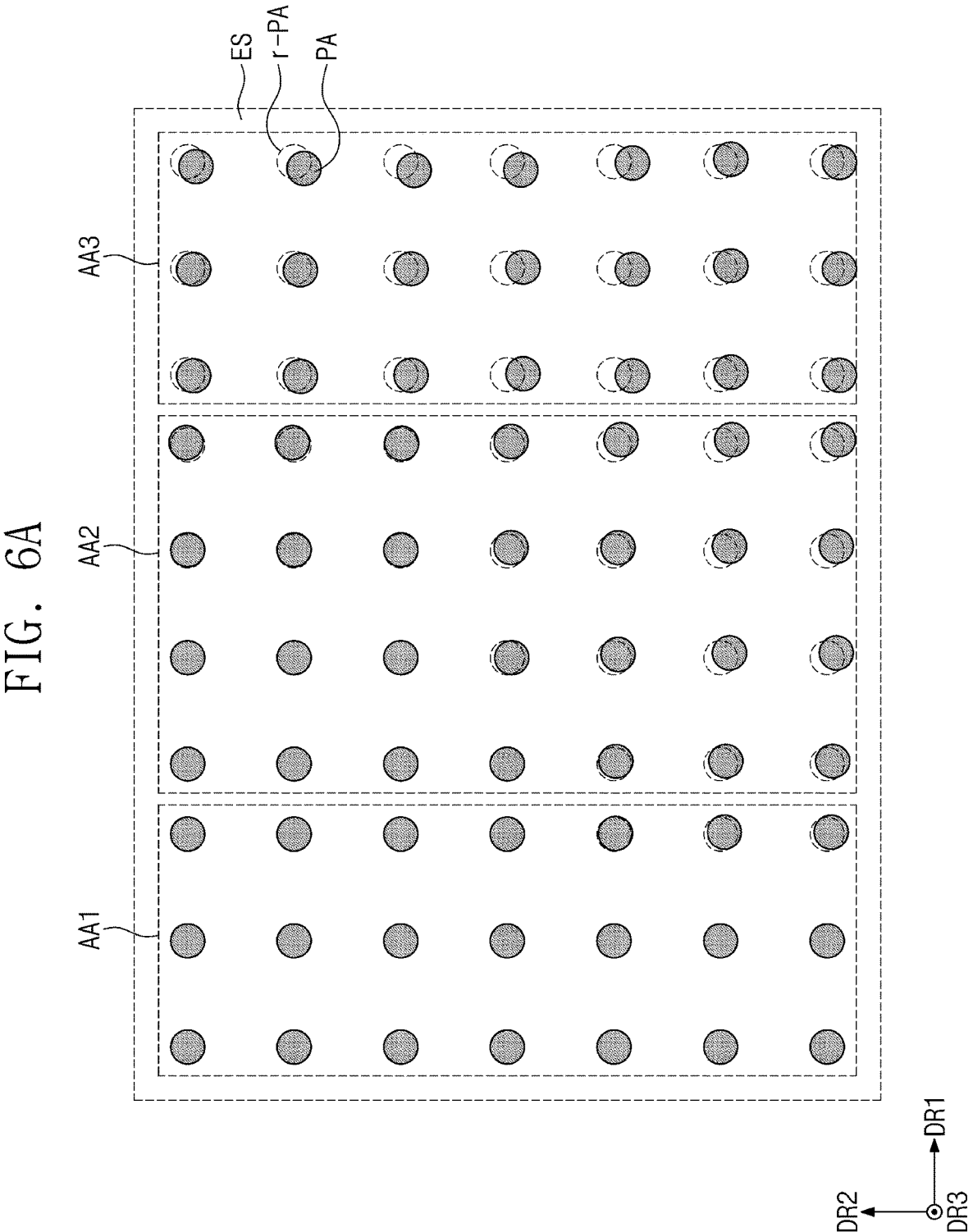
FIG. 6A is a schematic plan view of a deposition surface on which alignment patterns are formed according to an embodiment.
Figure 6B:
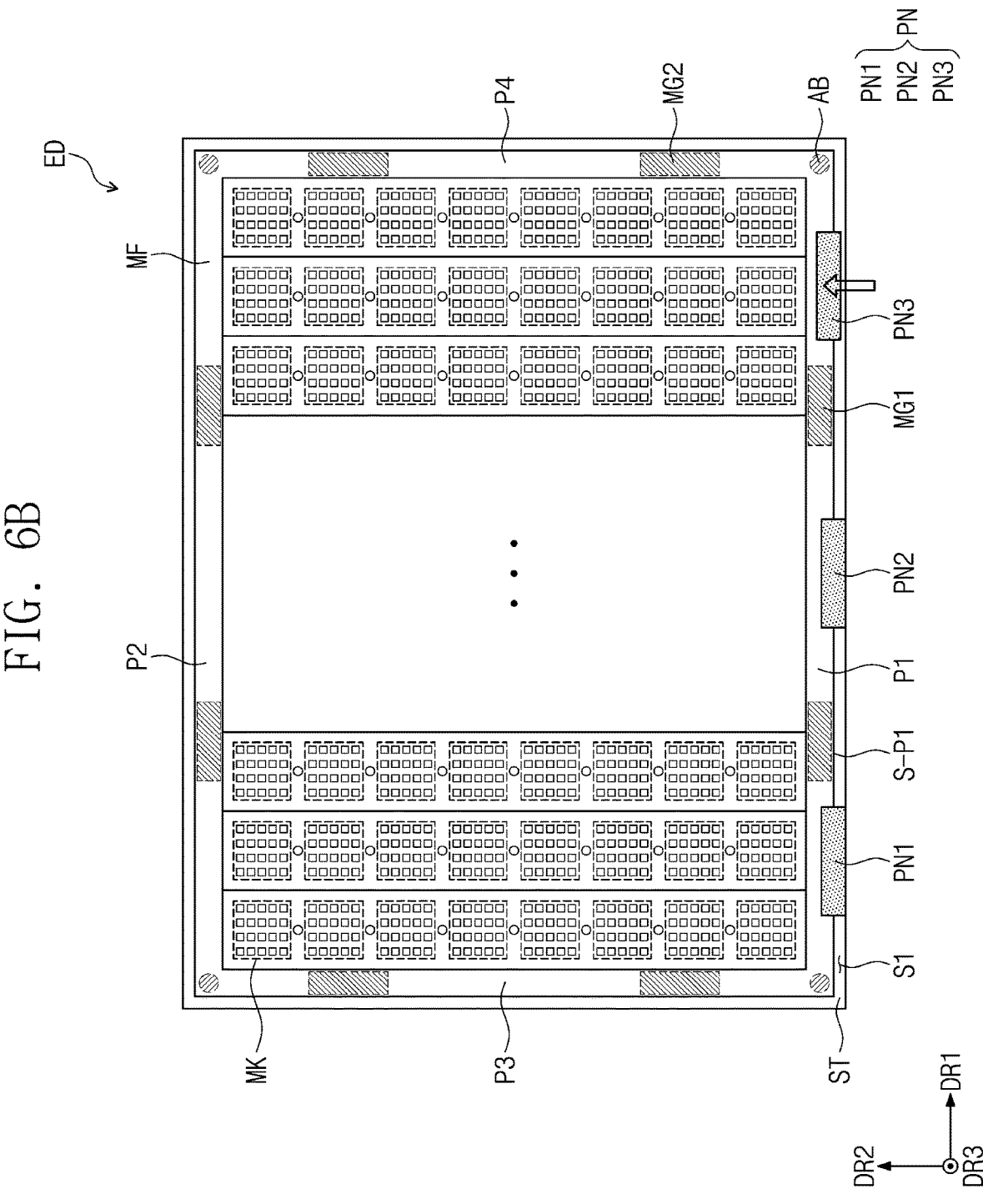
FIG. 6B is a schematic plan view of a deposition apparatus according to an embodiment.
Figure 7A:
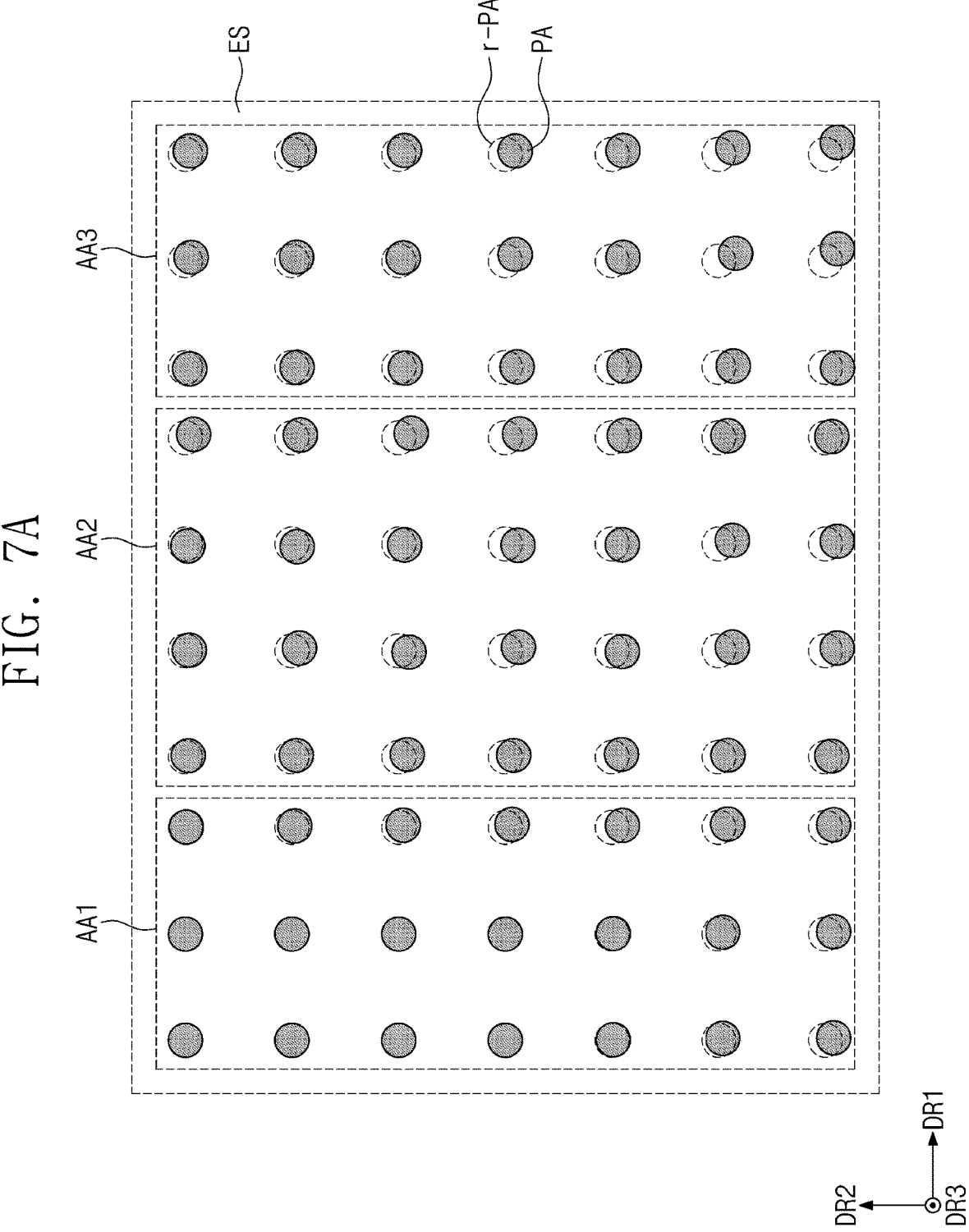
FIG. 7A is a schematic plan view of a deposition surface on which alignment patterns are formed according to an embodiment.
Figure 7B:
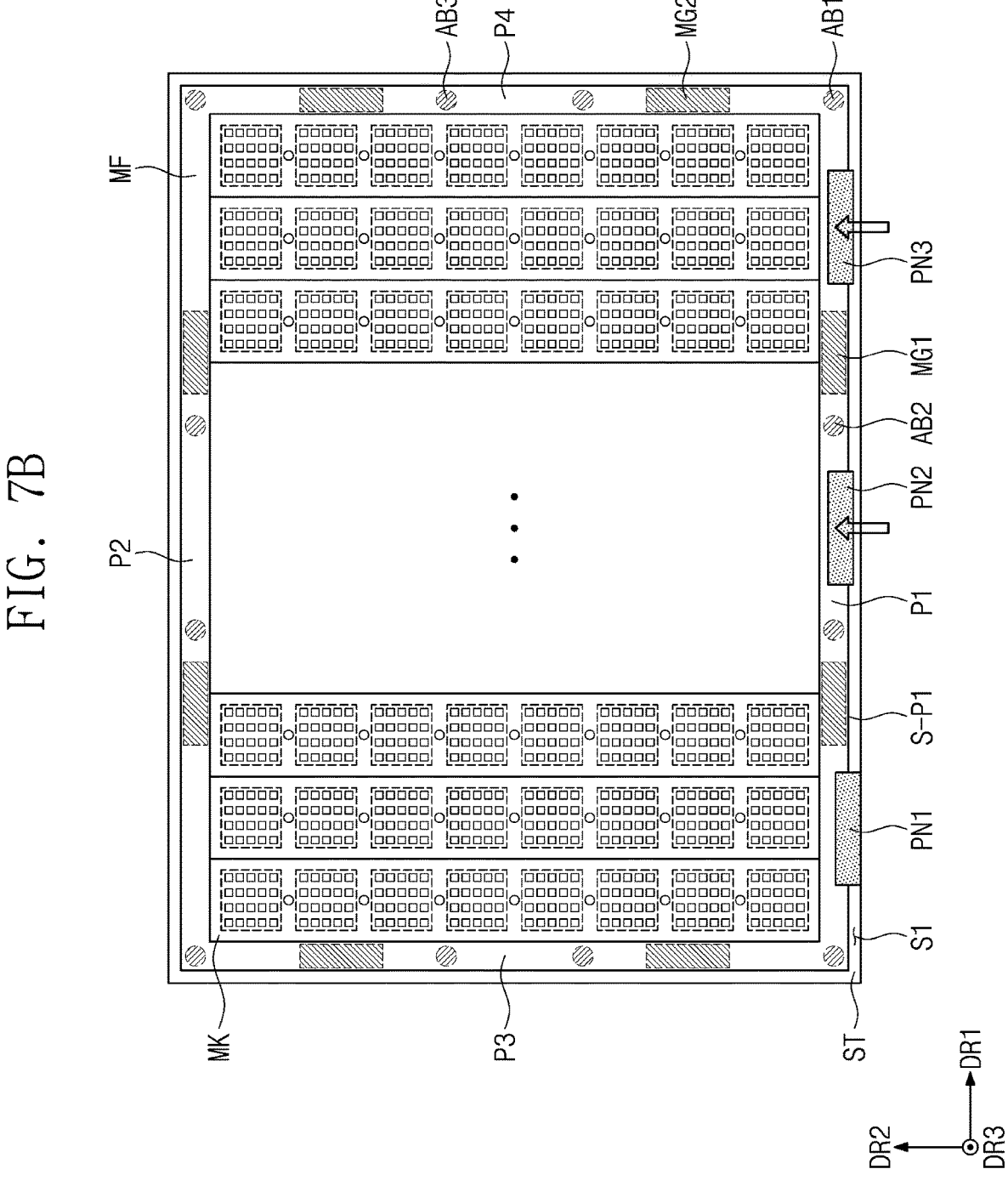
FIG. 7B is a schematic plan view of a deposition apparatus according to an embodiment.

Hereinafter, with reference to FIGS. 6A to 7B, embodiments of adjusting a pin unit PN in a deposition apparatus ED by arrangement of alignment patterns PA formed on a deposition surface ES will be described. FIGS. 6A and 7A are schematic plan views of a deposition surface ES on which alignment patterns PA are formed according to an embodiment. FIGS. 6B and 7B are schematic plan views of a deposition apparatus ED according to an embodiment. FIGS. 6B and 7B illustrate configurations of the deposition apparatus ED overlapped with the mask frame MF on the rear surface S2 of the stage ST (refer to FIG. 3A) by dotted lines, for convenience of description.

Referring to FIGS. 6A and 7A, the deposition surface ES may be a surface on which deposition patterns are formed. The deposition surface ES may correspond to a surface of the substrate SUB (refer to FIG. 2) to be processed. Positions where the deposition patterns are formed may be predicted (or measured) based on positions of alignment patterns PA formed on the deposition surface ES. The alignment patterns PA may be formed by simulation to correspond to positions of the second deposition openings OP-E2 of the mask MK (refer to FIG. 3B). FIGS. 6A and 7A illustrate only patterns corresponding to the alignment patterns PA among the deposition patterns, for convenience of description, and the alignment patterns PA are exaggerated.

Uniformity and deposition tendency of the deposition patterns may be predicted (or measured) by using the alignment patterns PA formed on the deposition surface ES. The pin unit PN, the magnet unit MG, and the adjustable block AB included in the deposition apparatus ED may be adjusted, and an external force may be applied to a specific region of the mask frame MF. Accordingly, the accuracy of the positions where the deposition patterns are formed may be improved.

Referring to FIGS. 6A to 7B, the deposition surface ES may be divided into first, second, and third regions AA1, AA2, and AA3 based on positions of first, second, and third pins PN1, PN2, and PN3 included in the pin unit PN. For example, the first, second, and third regions AA1, AA2, and AA3 may correspond to virtual regions for describing deposition tendency of the alignment pattern PA. The first region AA1 may correspond to a region in which the alignment patterns PA are formed by the masks MK disposed adjacent to the first pin PN1 within the deposition surface ES, and may be referred to as a left region. The second region AA2 may correspond to a region in which the alignment patterns PA are formed by the masks MK disposed adjacent to the second pin PN2 within the deposition surface ES, and may be referred to as a center region. The third region AA3 may correspond to a region in which the alignment patterns PA are formed by the masks MK disposed adjacent to the third pin PN3 within the deposition surface ES, and may be referred to as a right region.

Although the embodiment including the first, second, and third pins PN1, PN2, and PN3 are described as an example, in case that the number of pins PN1, PN2, and PN3 included in the pin unit PN is larger, the external force applied to the side surface S-P1 of the first portion P1 of the mask frame MF may be more precisely adjusted.

In a plan view, as the alignment patterns PA are formed to be aligned with each of reference alignment patterns r-PA, the deposition accuracy may be higher, and as the alignment patterns PA are formed to be deviated from each of the reference alignment patterns r-PA, the deposition accuracy may be lower. For example, the reference alignment patterns r-PA indicate positions where designed alignment patterns are formed. It is possible to predict a position of a region where the deposition accuracy tends to decrease, through the alignment patterns PA, and the pin unit PN, the magnet unit MG, and the adjustable block AB may be adjusted to improve deposition accuracy.

Referring to FIG. 6A, the deposition accuracy of the alignment patterns PA may be relatively low in a lower part of the third region AA3. For example, the deposition accuracy of the alignment patterns PA may be lowered in a region corresponding to a lower right side of the deposition surface ES. For example, the alignment patterns PA formed in the lower part of the third region AA3 may tend to be formed below the reference alignment patterns r-PA in a plan view.

As illustrated in FIG. 6B, in order to improve the deposition accuracy, the third pin PN3 disposed in the lower part of the third region AA3 may move in the second direction DR2, and an external force applied by the third pin PN3 to a right of the side surface S-P1 of the first portion P1 may be increased. For example, the length of the adjustable block AB disposed adjacent to the lower part of the third region AA3 in the third direction DR3 may be adjusted and thus the external force applied to the rear surface of the mask frame MF may be increased. Further, the positions of the electro permanent magnets MG1 and MG2 may be adjusted, and thus a position at which an attractive force is applied to the mask frame MF may be adjusted. Accordingly, the degree to which the alignment patterns PA are non-uniformly formed in the first direction DR1 and the second direction DR2 with respect to the reference alignment patterns r-PA may be reduced.

Referring to FIG. 7A, the deposition accuracy of the alignment patterns PA may be relatively low in lower parts of the second region AA2 and the third region AA3. For example, the alignment patterns PA formed at the lower parts of the second region AA2 and the third region AA3 may tend to be formed below the reference alignment patterns r-PA in a plan view.

As shown in FIG. 7B, in order to improve the deposition accuracy, the second pin PN2 and the third pin PN3 overlapping the lower part of the second region AA2 and the lower part of the third region and AA3, respectively, may move in the second direction DR2. Accordingly, the external force applied to the center and right of the side surface S-P1 of the first portion P1 by each of the second pin PN2 and the third pin PN3 may be increased. The length in the third direction DR3 of each of adjustable blocks disposed adjacent to the lower parts of the second region AA2 and the third region AA3 among the first and second adjustable blocks AB1 and AB2 may be adjusted, and thus the external force applied to the rear surface of the mask frame MF may be adjusted. Accordingly, the degree to which the alignment patterns PA are non-uniformly formed in the first direction DR1 and the second direction DR2 may be reduced.

As the number of adjustable blocks AB disposed in the extension direction of the mask frame MF increases, the external force applied to the mask frame MF may be finely (or precisely) adjusted according to the regions, thereby effectively improving the deposition accuracy.

The deposition apparatus ED according to an embodiment may include the pin unit PN and the magnet unit MG for adjusting the position at which the mask frame MF is seated (or disposed) on the stage ST. The pin unit PN may include the pins supporting the side surface of the mask frame MF, may move in a direction supporting the side surface thereof, and may adjust the external force applied to the mask frame MF. The magnet unit MG may include the electro permanent magnets (e.g., MG1 and MG2) that generate the magnetic force to fix the mask frame MF on the seating surface of the stage ST. The electro permanent magnets (e.g., MG1 and MG2) may move in a direction in a plan view and may adjust the external force applied on the rear surface of the mask frame MF. In the deposition apparatus ED and deposition method according to an embodiment, as the pin unit PN and the magnet unit MG move, the alignment position of the mask frame MF may be adjusted, and thus deposition accuracy may be improved.

The deposition apparatus ED according to an embodiment may further include the adjustable block AB disposed on the rear surface of the stage ST to adjust the external force applied from the stage to the mask frame by adjusting the length thereof. As the arrangement and length of the adjustable block AB are adjusted, deformation caused by gravity acting on the mask frame MF or inherent tension or compressive force acting inside of the mask frame MF may be compensated, and the deterioration deposition accuracy caused by deformation of the mask frame MF may be prevented.

In the deposition apparatus according to an embodiment, the alignment position of the mask MK and the mask frame MF may be adjusted by the pin unit PN, the magnet unit MG, and the adjustable block AB provided (or disposed) on the stage ST, and the non-uniformity of the deposition pattern may be compensated. Accordingly, replacement of the mask having the deteriorated deposition accuracy may be minimized, thereby reducing cost of the deposition process.

In the deposition apparatus ED of an embodiment, the seating surface of the stage ST and the mask frame MF disposed on the seating surface may be provided (or disposed) vertically in the chamber CB, and thus vertical deposition may be performed. Accordingly, the mask MK having a large-area may be prevented from descending due to gravity, a deflection of the mask MK may be reduced or minimized, and deposition reliability by using the deposition apparatus ED may be improved. Further, it is possible to improve non-uniform deposition of deposition patterns by vertical deposition by using the pin unit PN, the magnet unit MG, and the adjustable block AB.

Although the inventive concept has been described with an embodiment, it is intended that the inventive concept encompass such various changes and modifications to one skilled in the art as fall within the scope of the appended claims.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A deposition apparatus comprising:
a mask including deposition openings;
a mask frame including a front surface facing the mask and a rear surface opposite to the front surface, the mask frame connected to the mask and including:
first, second, third, fourth portions and
an opening surrounded by the first, second, third, and fourth portions, the opening overlapping the deposition openings;
a stage disposed on the rear surface of the mask frame, the stage including a front surface facing the rear surface of the mask frame and a rear surface opposite to the front surface of the stage;

wherein the stage includes an upper part, side parts, and a lower part defining a stage opening;
a plurality of pins connected to the stage only at the lower part of the stage and arranged in a first direction, the plurality of pins extending from the front surface of the stage to cover a side surface and the front surface of the first portion of the mask frame; and
a magnet disposed on the rear surface of the stage and overlapping the mask frame, wherein
each of the first portion and the second portion of the mask frame extends in the first direction,
each of the third portion and the fourth portion of the mask frame extends in a second direction intersecting the first direction, and
the plurality of pins face the side surface and the front surface of the first portion of the mask frame and are movable in the second direction such that the inclination angle of the front surface of the mask frame can be adjusted.

2. The deposition apparatus of claim 1, wherein each of the plurality of pins is independently movable in the second direction.

3. The deposition apparatus of claim 1, wherein
the stage is disposed between the magnet and the rear surface of the mask frame,
the magnet includes a plurality of electro permanent magnets, and
the plurality of electro permanent magnets are disposed on the rear surface of the stage to overlap at least one of the first, second, third, and fourth portions of the mask frame.

4. The deposition apparatus of claim 3, wherein
the plurality of electro permanent magnets include:
first electro permanent magnets overlapping the first portion or the second portion of the mask frame; and
second electro permanent magnets overlapping the third portion or the fourth portion of the mask frame,
the first electro permanent magnets are movable in the first direction, and
the second electro permanent magnets are movable in the second direction.

5. The deposition apparatus of claim 4, wherein the first electro permanent magnets and the second electro permanent magnets are independently movable.

6. The deposition apparatus of claim 1, further comprising:
an adjustable block spaced apart from the magnet on the rear surface of the stage,
wherein the adjustable block overlaps the mask frame in a plan view.

7. The deposition apparatus of claim 6, wherein the adjustable block has a variable length in a third direction intersecting the first direction and the second direction.

8. The deposition apparatus of claim 7, wherein
the adjustable block includes a plurality of adjustable blocks, and
the plurality of adjustable blocks include first adjustable blocks overlapping corner portions of the mask frame.

9. The deposition apparatus of claim 8, wherein the plurality of adjustable blocks further include:
second adjustable blocks overlapping the first portion or the second portion of the mask frame; and
third adjustable blocks overlapping the third portion or the fourth portion of the mask frame.

10. The deposition apparatus of claim 1, wherein each of the mask and the mask frame includes a metal.

11. The deposition apparatus of claim 1, further comprising:

a chamber including an internal space where the mask, the mask frame, the stage, the pin, and the magnet are disposed, wherein the side surface of the first portion of the mask frame faces a bottom surface of the chamber.

12. A deposition apparatus comprising:

a chamber including an internal space;

a stage including a seating surface and a rear surface opposite to each other, the seating surface perpendicular to a bottom surface of the chamber;

a mask frame including a front surface and a rear surface opposite to each other, the rear surface of the mask frame facing the seating surface of the stage, the mask frame disposed on the seating surface of the stage and including a plurality of portions and an opening surrounded by the plurality of portions;

a mask disposed on the front surface of the mask frame and overlapping the opening of the mask frame;

a plurality of pins extending from the seating surface of the stage to cover a side surface and the front surface of the mask frame, the plurality of pins facing the side surface and the front surface of the mask frame extending a first direction substantially parallel to the bottom surface of the chamber; and a magnet disposed on the rear surface of the stage, wherein the plurality of pins are disposed only on the seating surface of the stage, are spaced apart from each other, and are movable in a second direction substantially perpendicular to the first direction such that the inclination angle of the front surface of the mask frame can be adjusted.

13. The deposition apparatus of claim 12, wherein the pin and the magnet overlap each other with the stage disposed between the pin and the magnet, the magnet includes:

first electro permanent magnets disposed on a first portion of the stage extending in the first direction substantially parallel to the side surface of the mask frame, and second electro permanent magnets disposed on a second portion of the stage extending in the second direction substantially perpendicular to the side surface of the mask frame, the first electro permanent magnets are movable in the first direction, and the second electro permanent magnets are movable in the second direction.

14. The deposition apparatus of claim 13, further comprising:

a plurality of adjustable blocks disposed on the rear surface of the stage and spaced apart from the magnet, wherein the plurality of adjustable blocks are disposed on the first portion and the second portion of the stage, and the plurality of adjustable blocks have variable lengths in a direction substantially perpendicular to the rear surface of the stage.

15. The deposition apparatus of claim 14, wherein the plurality of adjustable blocks include:

a first group of adjustable blocks disposed between the first electro permanent magnets in the first direction; and a second group of adjustable blocks disposed between the second electro permanent magnets in the second direction.

* * * * *